United States Patent
Yang et al.

(10) Patent No.: US 11,848,669 B2
(45) Date of Patent: Dec. 19, 2023

(54) WAKE-UP CIRCUIT AND WAKE-UP METHOD

(71) Applicant: ZTE CORPORATION, Guangdong (CN)

(72) Inventors: Qian Yang, Guangdong (CN); Xin Jiang, Guangdong (CN); Jijie Shi, Guangdong (CN); Teng Zhang, Guangdong (CN)

(73) Assignee: ZTE CORPORATION, Shenzhen (CN)

( * ) Notice: Subject to any disclaimer, the term of this patent is extended or adjusted under 35 U.S.C. 154(b) by 111 days.

(21) Appl. No.: 17/614,387

(22) PCT Filed: May 9, 2020

(86) PCT No.: PCT/CN2020/089446
§ 371 (c)(1),
(2) Date: Nov. 26, 2021

(87) PCT Pub. No.: WO2021/051826
PCT Pub. Date: Mar. 25, 2021

(65) Prior Publication Data
US 2022/0231688 A1     Jul. 21, 2022

(30) Foreign Application Priority Data
Sep. 19, 2019   (CN) .......................... 201910886726.2

(51) Int. Cl.
*H03K 19/17704*   (2020.01)
*H03K 5/14*   (2014.01)
*H03K 19/17736*   (2020.01)
*H03K 19/21*   (2006.01)

(52) U.S. Cl.
CPC ......... *H03K 19/17716* (2013.01); *H03K 5/14* (2013.01); *H03K 19/17744* (2013.01); *H03K 19/21* (2013.01)

(58) Field of Classification Search
None
See application file for complete search history.

(56) References Cited

U.S. PATENT DOCUMENTS 6,738,914 B2 *  5/2004  Christopher .......... G06F 1/3203
                                                    713/323

FOREIGN PATENT DOCUMENTS

| CN | 201838037 U | 5/2011 |
| CN | 102468821 A | 5/2012 |
| CN | 205632361 U | 10/2016 |
| CN | 109597394 A | 4/2019 |

OTHER PUBLICATIONS

International search report of PCT Patent Application No. PCT/CN2020/089446 dated Jul. 30, 2020.

* cited by examiner

*Primary Examiner* — Jany Richardson

(57) ABSTRACT

A wake-up circuit, a wake-up method and a non-transitory computer-readable storage medium are disclosed. The wake-up circuit includes a wake-up module (11) and a main control module (12). The wake-up module (11) is connected to a wake-up source and is configured to detect a wake-up signal sent by the wake-up source, and to forward the wake-up signal to the main control module (12), one or more wake-up sources being provided. The main control module (12) is connected to the wake-up module (11) and is configured to receive the forwarded wake-up signal, one main control modules (12) being provided.

14 Claims, 8 Drawing Sheets

WAKE-UP CIRCUIT AND WAKE-UP METHOD

CROSS-REFERENCE TO RELATED APPLICATION

The present disclosure claims the priority of Chinese patent application CN 201910886726.2, entitled "Wake-up Circuit and Wake-up Method" and filed on Sep. 19, 2019, the entirety of which is incorporated herein by reference.

FIELD OF THE INVENTION

The present disclosure relates to the technical field of wake-up circuits, and in particular, to a wake-up circuit, a wake-up method, a non-transitory computer-readable storage medium and a processor.

BACKGROUND OF THE INVENTION

Telematics BOX is also called as vehicle-mounted T-BOX. A telematics system includes four parts, i.e., a host, a vehicle-mounted T-BOX, a cellphone APP, and a background system. The host is mainly used for audio and video entertainment within a vehicle and vehicle information displaying. The vehicle-mounted T-BOX is mainly used for communicating with the background system or the cellphone APP, so as to realize vehicle information displaying and controlling with the cellphone APP.

When a user sends a control command through the cellphone APP, a background system such as TSP background sends the control command to the vehicle-mounted T-BOX. After acquiring the control command, the vehicle-mounted T-BOX sends a control message through a CAN bus to realize control over the vehicle, and finally feeds an operation result back to the cellphone APP of the user. Such a function can help the user to start the vehicle, turn on the conditioner, adjust the seat to a proper position, and so on remotely.

A main device for detecting a wake-up signal in existing vehicle-mounted T-BOX products is a wake-up circuit including a first comparator. The first comparator is coupled to an input signal and is configured to compare the input signal with a first comparison value. The wake-up circuit includes a second comparator, which is coupled to the input signal, and which is configured to compare the input signal with a second comparison value. The wake-up circuit further includes an exclusive-OR gate. A first input of the exclusive-OR gate is coupled to an output of the first comparator. A second input of the exclusive-OR gate is coupled to an output of the second comparator. The wake-up circuit further includes a tunable charge pump which is coupled to an output of the exclusive-OR gate, and which is configured to convert a signal from the exclusive-OR gate into a DC value so as to wake up a monitored circuit. The solution of the wake-up circuit uses a relatively large number of comparators with respect to one wake-up source, thus resulting in increased costs, and this wake-up circuit can only detect the input signal of one wake-up source and will fails to perform detection when there are multiple wake-up sources.

With respect to the above problems existing in relevant technologies, no effective solution has been found so far.

SUMMARY OF THE INVENTION

It is provided a wake-up circuit, a wake-up method, a non-transitory computer-readable storage medium and a processor. By using one main control module to connect with several wake-up sources, the cost of the wake-up circuit will be reduced, and the wake-up circuit and the wake-up method are suitable for detection of multiple wake-up sources.

An embodiment of the present disclosure provides a wake-up circuit, including: a wake-up module, which is connected to a wake-up source, and which is configured to detect a wake-up signal sent by the wake-up source and forward the wake-up signal to a main control module, one or more wake-up sources being provided; and the main control module, which is connected to the wake-up module, and which is configured to receive the wake-up signal forwarded, one main control module being provided.

An embodiment of the present disclosure further provides a wake-up method, including: using the wake-up circuit to perform wake-up.

An embodiment of the present disclosure further provides a wake-up method, including: detecting a wake-up signal sent by the wake-up source, and forwarding the wake-up signal; and receiving the wake-up signal forwarded.

An embodiment of the present disclosure further provides a non-transitory computer-readable storage medium which includes a stored program. The program, when running, executes any of the above methods.

An embodiment of the present disclosure further provides a processor which is configured for running of a program. The program, when running, executes any of the above method.

Features and advantages of the present disclosure will be set forth in the following description and will partly become evident in the description or be understood by implementing the present disclosure. The objective and other advantages of the present disclosure may be achieved and obtained through structures specifically pointed out in the description, claims, and accompanying drawings.

DETAILED DESCRIPTION OF THE EMBODIMENTS

Embodiments of the present disclosure will be illustrated in detail hereinafter in combination with the accompanying drawings.

It should be noted that the embodiments in the present disclosure and the features in the embodiments can be combined with one another as long as there is no conflict. It should be noted that the terms "first", "second" and so on in the description and claims of the present disclosure and the aforementioned drawings are used to distinguish similar objects, and are not necessarily used to describe a specific sequence or order.

Embodiment One

Application scenarios of a wake-up circuit in the embodiment include: a wake-up circuit of a vehicle-mounted T-BOX, a product with multiple wake-up sources, and the like. The wake-up circuit has a wide application prospect.

Figure 1:
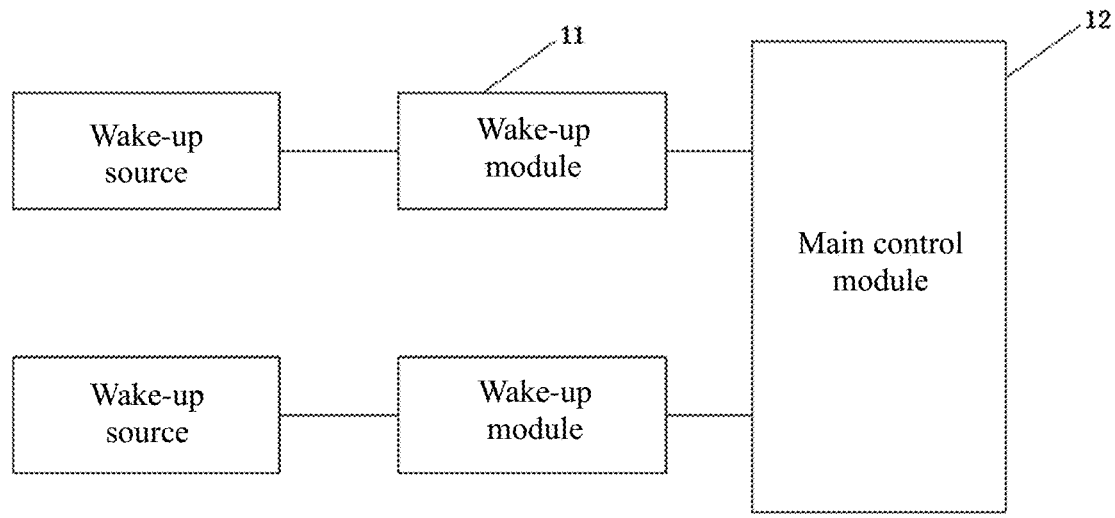
FIG. 1 is a structural diagram of a wake-up circuit according to an embodiment of the present disclosure.

The embodiment provides a wake-up circuit, as shown in FIG. 1, which may include a wake-up module 11 and a main control module 12. The wake-up module 11 is connected to a wake-up source and is configured to detect a wake-up signal sent by the wake-up source and forward the wake-up signal to a main control module, one or more wake-up sources being provided. The main control module 12 is connected to the wake-up module and is configured to receive the wake-up signal forwarded, one main control module being provided.

In the embodiment, a wake-up module detects a wake-up signal sent by a wake-up source and forwards the wake-up signal to a main control module, one or more wake-up sources being provided; the main control module is connected to the wake-up module and is configured to receive the wake-up signal forwarded, one main control module being provided. In this way, several wake-up sources may be connected to one main control module, and the one main control module may receive wake-up signals sent by multiple wake-up sources, so that the cost of the wake-up circuit is reduced and that the wake-up circuit is suitable for detection of multiple wake-up sources, thereby solving the problems in related technologies that the cost is high due to a relatively large number of comparators used for one wake-up source and that the wake-up circuit cannot perform detection when there are multiple wake-up sources.

Figure 2:
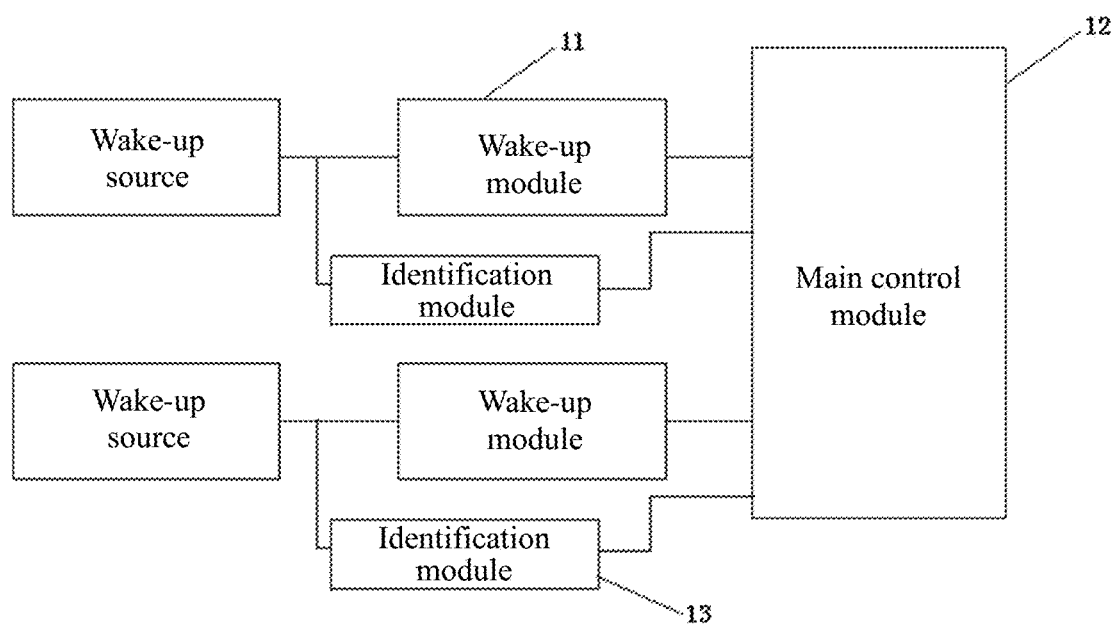
FIG. 2 is another structural diagram of the wake-up circuit according to an embodiment of the present disclosure.

As shown in FIG. 2, in an embodiment, the wake-up circuit further includes an identification module 13, which is connected between the wake-up source connected to the wake-up module and the main control module, and which is configured to send the wake-up signal transmitted by the wake-up source to the main control module for identification.

In this way, the wake-up signal can be identified by the main control module to distinguish the wake-up source which transmits the wake-up signal, so that sources of wake-up signals cannot be mixed up.

In an embodiment, wake-up modules and wake-up sources connected to the wake-up modules are provided in one-to-one correspondence, and the wake-up sources and identification modules connected to the wake-up sources are provided in one-to-one correspondence.

By utilizing such a manner of one-to-one correspondence, it can be easier for the main control module to identify the wake-up signal transmitted by the wake-up source.

Figure 3:
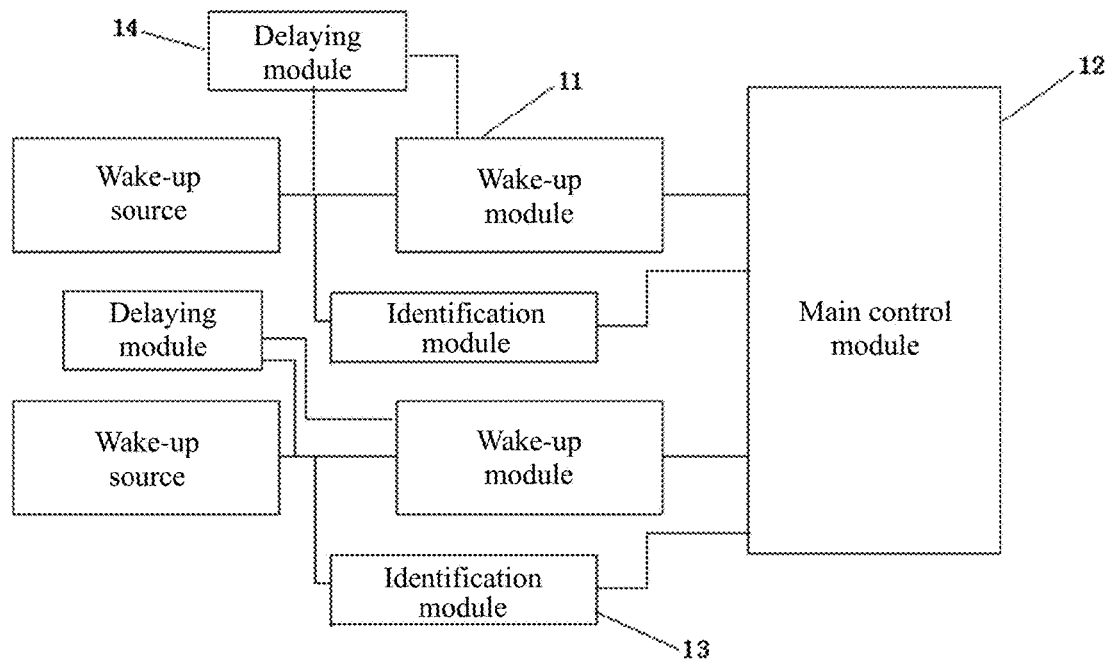
FIG. 3 is another structural diagram of the wake-up circuit according to an embodiment of the present disclosure.

As shown in FIG. 3, in an embodiment, the wake-up circuit further includes a delaying module 14, which is connected between the wake-up source connected to the wake-up module and the wake-up module, and which is configured to perform delaying on the wake-up signal transmitted by the wake-up source before transmitting the wake-up signal in the form of a pulse signal to the main control module, wake-up modules and delaying modules connected to the wake-up modules being provided in one-to-one correspondence.

In this way, each time when each of different wake-up modules transmits a wake-up signal, a corresponding delaying module performs delaying on the wake-up signal before the signal in the form of a pulse signal can be transmitted to the main control module, so that the main control module can efficiently receive the wake-up signal transmitted in the form of the pulse signal, so as to achieve a wake-up function of the wake-up signal more accurately.

Figure 4:
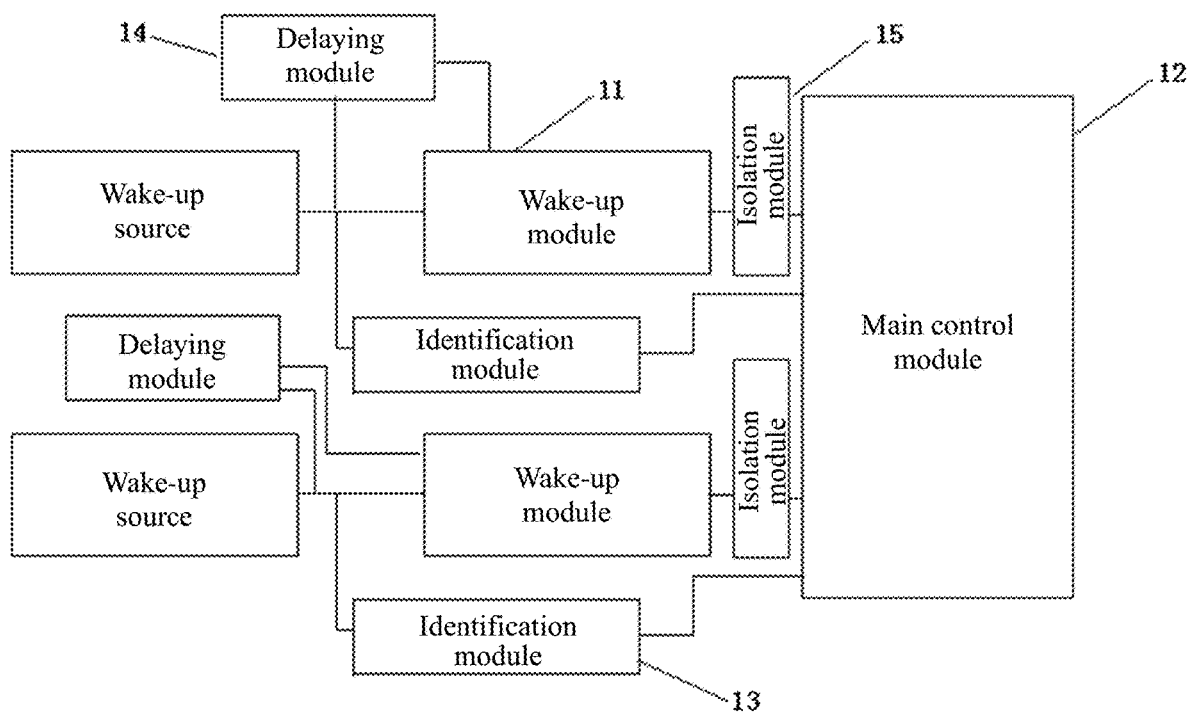
FIG. 4 is another structural diagram of the wake-up circuit according to an embodiment of the present disclosure.

As shown in FIG. 4, in an embodiment, the wake-up circuit further includes an isolation module 15, which is connected between the wake-up module and the main control module, and which is configured to isolate a backflow current transmitted by the main control module to the wake-up module, wake-up modules and isolation modules connected to the wake-up modules being provided in one-to-one correspondence.

In this way, by using the isolation module, the backflow current transmitted from the main control module to the wake-up module can be prevented from causing damage to the wake-up module.

In an embodiment, the wake-up module is an exclusive-OR gate with a first input connected to an output of the wake-up source and with a second input connected to an end of the delaying module, the other end of the delaying module being connected to the output of the wake-up source, and an output of each of exclusive-OR gates being connected to one pin of the main control module. The exclusive-OR gate is configured to perform operation on a wake-up signal output from the output of the wake-up source and a delayed signal formed after the wake-up signal undergoes delaying by the delaying module, before transmitting the wake-up signal in the form of the pulse signal to the main control module.

In this way, by transmitting the wake-up signal in the form of the pulse signal to the main control module, the main control module can distinguish the wake-up signal, so as to achieve the purpose of distinguishing several wake-up signals. Accordingly, even when there are multiple wake-up sources, the purpose of detecting several wake-up signals transmitted by the multiple wake-up sources can be achieved, and the exclusive-OR gate is cost effective.

In an embodiment, the main control module is a MCU, and the pin of the MCU connected to the output of each of the exclusive-OR gates is configured to receive the wake-up signal transmitted in the form of the pulse signal. The MCU further includes pins which are provided in one-to-one correspondence with identification modules, an end of each of the identification modules being connected to a corresponding pin of the MCU, and the other end of each of the identification modules being connected to the output of a corresponding wake-up source.

In this way, the MCU is used as the main control module, and the MCU is a single-chip with low cost. By using one pin of the MCU to receive wake-up signals transmitted by several wake-up sources, one main control module can enable connection to several wake-up sources, and thus the wake-up signals transmitted from multiple wake-up sources can be received by one main control module, so that the cost of the wake-up circuit is reduced and that the wake-up circuit is suitable for detection of multiple wake-up sources. Two ends of the identification module are respectively connected to the corresponding wake-up source and the corresponding pin of the MCU. In this way, the wake-up signal sent from the output of the wake-up source can be transmitted via the identification module to the corresponding pin of the MCU, so as to facilitate distinguishing the wake-up source which sends the wake-up signal.

In an embodiment, the identification module is a first resistor, which is configured to perform current-limiting on the wake-up signal sent from the output of the wake-up source to the corresponding pin of the MCU before transmitting the wake-up signal to the MCU for identification.

In this way, by performing current-limiting on the wake-up signal and then transmitting the wake-up signal to the MCU for identification, the signal transmitted to the MCU is safer and more reliable.

In an embodiment, the delaying module is an RC delaying circuit, which includes a second resistor and a first capacitor.

An end of the second resistor is connected to the output of the wake-up source, and the other end of the second resistor and one electrode of the first capacitor are connected to the second input of the exclusive-OR gate, the other electrode of the first capacitor being grounded.

In this way, by using the second resistor and the first capacitor of the RC delaying circuit which is cheap and cost effective, and the effect of delaying the wake-up signal can be achieved efficaciously.

The isolation module may be a diode. An anode of each of diodes is connected to the output of a respective one of exclusive-OR gates, and a cathode of each of the diodes is connected to the one pin of the MCU.

In this way, the connection manner of the diode can effectively prevent the backflow current transmitted from the MCU to the wake-up module from causing damage to the exclusive-OR gate.

Embodiment Two

The embodiment further provides a wake-up method, which includes the step of using a wake-up circuit to perform wake-up. The wake-up circuit includes a wake-up module and a main control module. The wake-up module is connected to a wake-up source and is configured to detect a wake-up signal sent by the wake-up source and forward the wake-up signal to the main control module, one or more wake-up sources being provided. The main control module is connected to the wake-up module and is configured to receive the wake-up signal forwarded, one main control module being provided.

Figure 5:
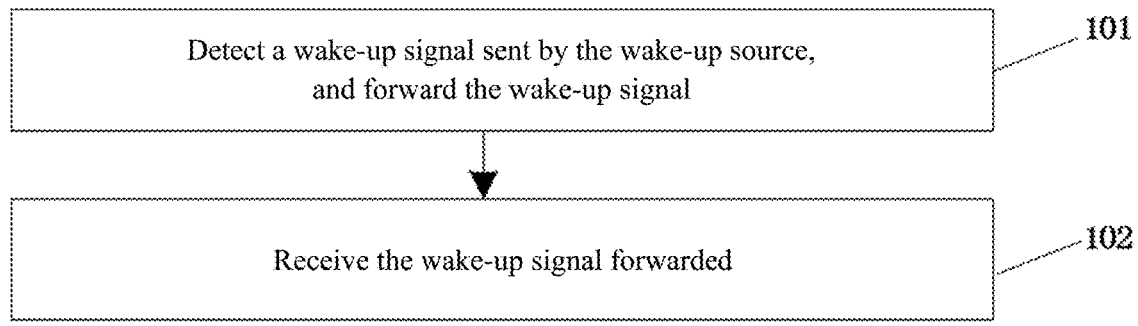
FIG. 5 is a flowchart of a wake-up method according to an embodiment of the present disclosure.

The embodiment further provides a wake-up method, as shown in FIG. 5, which may correspond to the implementation principle of the wake-up circuit, and which may include the following steps. At step 101, a wake-up signal sent by the wake-up source is detected, and the wake-up signal is forwarded. At step 102, the wake-up signal forwarded is received.

Figure 6:
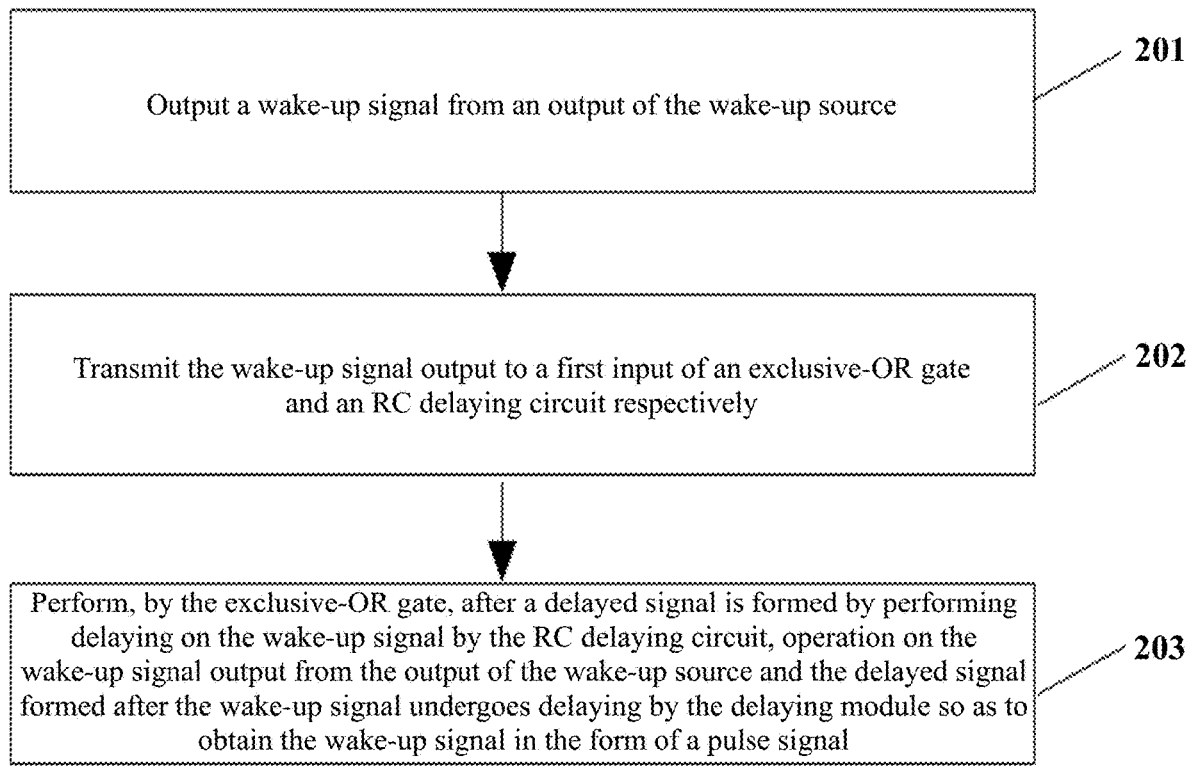
FIG. 6 is a flowchart of a method of detecting a wake-up signal sent by a wake-up source according to an embodiment of the present disclosure.

As shown in FIG. 6, the wake-up signal sent by the wake-up source being detected may include the following steps. At step 201, a wake-up signal is output from an output of the wake-up source. At step 202, the wake-up signal output is transmitted to a first input of an exclusive-OR gate and an RC delaying circuit respectively. At step 203, after a delayed signal is formed by performing delaying on the wake-up signal by the RC delaying circuit, the exclusive-OR gate performs operation on the wake-up signal output from the output of the wake-up source and the delayed signal formed after the wake-up signal undergoes delaying by the delaying module so as to obtain the wake-up signal in the form of a pulse signal.

Figure 7:
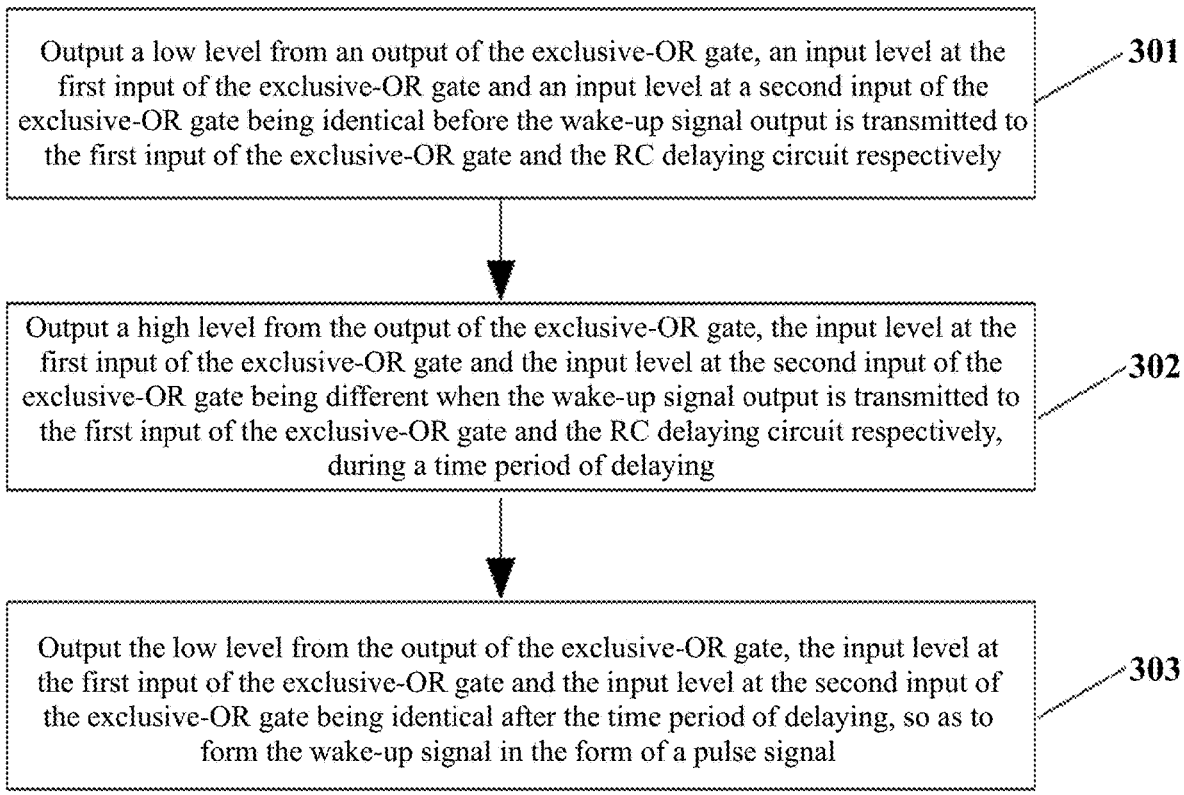
FIG. 7 is a flowchart of a method of performing, by an exclusive-OR gate, operation on a wake-up signal output from an output of the wake-up source and a delayed signal formed after the wake-up signal undergoes delaying by a delaying module so as to obtain the wake-up signal in the form of a pulse signal according to an embodiment of the present disclosure.

In an embodiment, as shown in FIG. 7, the exclusive-OR gate performing operation on the wake-up signal output from the output of the wake-up source and the delayed signal formed after the wake-up signal undergoes delaying by the delaying module so as to obtain the wake-up signal in the form of the pulse signal may include the following steps. At step 301, before the wake-up signal output is transmitted to the first input of the exclusive-OR gate and the RC delaying circuit respectively, an input level at the first input of the exclusive-OR gate and an input level at a second input of the exclusive-OR gate are identical, a low level is output from an output of the exclusive-OR gate. At step 302, when the wake-up signal output is transmitted to the first input of the exclusive-OR gate and the RC delaying circuit respectively, during a time period of delaying, the input level at the first input of the exclusive-OR gate and the input level at the second input of the exclusive-OR gate are different, and a high level is output from the output of the exclusive-OR gate. At step 303, after the time period of delaying, the input level at the first input of the exclusive-OR gate and the input level at the second input of the exclusive-OR gate are identical, a low level is output from the output of the exclusive-OR gate, so that the wake-up signal in the form of a pulse signal is formed.

In this way, the one pin of a MCU which is usually configured to receive the wake-up signal can only detect a rising edge of the wake-up signal, and if this pin is directly connected with the output of each of multiple wake-up sources, after only identifying the wake-up signal once, the pin cannot detect the next wake-up signal because the pin receives a high level from the output of the wake-up source at the first time and remains the high level continuously. By forming the wake-up signal in the form of the pulse signal, the pin is able to receive a pulse signal converted from a previous wake-up signal having only one rising edge, so that the MCU can performs distinguishing on the wake-up signal.

Figure 8:
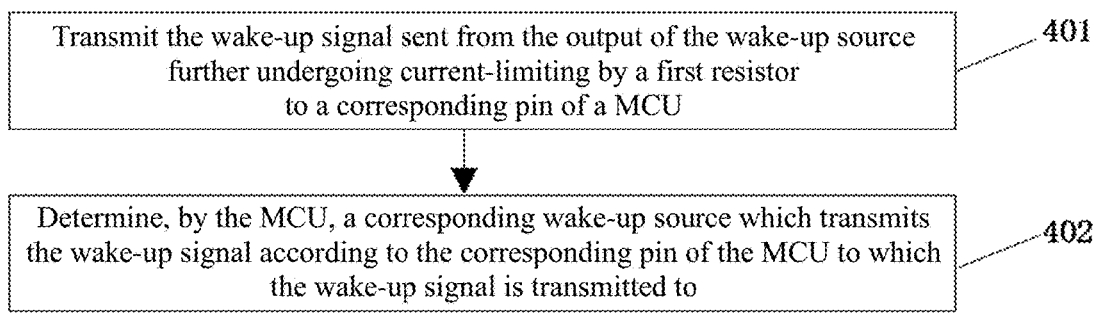
FIG. 8 is another flowchart of the method of detecting the wake-up signal sent by the wake-up source according to an embodiment of the present disclosure.

In an embodiment, as shown in FIG. 8, the wake-up signal sent by the wake-up source being detected further includes the following steps. At step 401, the wake-up signal sent from the output of the wake-up source further undergoing current-limiting by a first resistor is transmitted to a corresponding pin of an MCU. At step 402, the MCU determines a corresponding wake-up source which transmits the wake-up signal according to the corresponding pin of the MCU to which the wake-up signal is transmitted to.

In this way, based on a correspondence relationship between wake-up sources and pins of the MCU, the specific wake-up source can be identified, so that the MCU receive the wake-up signal more accurately and efficiently.

Based on the above description of the implementation manner, those skilled in the art can clearly understand that the method in the above embodiment may be implemented by software plus a necessary general-purpose hardware platform or may be implemented by hardware for sure, but the former is a preferred implementation manner in most cases. Based on such understanding, the technical solution of the embodiment essentially or a portion of the technical solution of the embodiment that contributes to the existing technologies may be embodied in the form of a software product. This computer software product is stored in a storage medium (such as an ROM/RAM, a magnetic disk, and an optical disk), and includes several instructions for enabling a terminal device (which may be a cellphone, a computer, a server, or a network device) to implement methods in various embodiments of the present disclosure.

Embodiment Three

Figure 9:
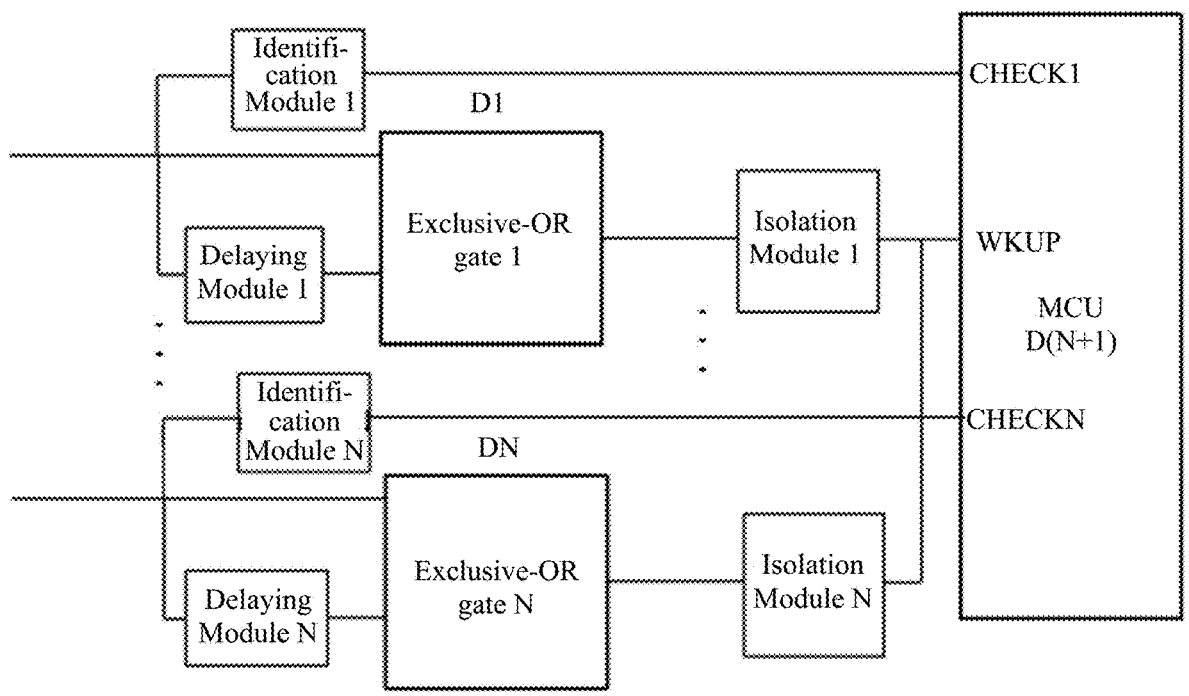
FIG. 9 is a structural diagram of a wake-up circuit according to an embodiment of the present disclosure.

As shown in FIG. 9, the wake-up circuit in the embodiment includes: a MCU serving as a main control module, marked as D(n+1) in FIG. 9; N exclusive-OR gates, marked as D1 to DN in FIG. 9; N identification modules, marked as identification module 1 to identification module N in FIG. 9; N delaying modules, marked as delaying module 1 to delaying module N in FIG. 9; and N isolation modules, marked as isolation module 1 to isolation module N in FIG. 9, where N is a positive integer, and indicates the number of the exclusive-OR gate, the number of the delaying modules, the number of the identification modules, and the number of the isolation modules.

The MCU in the embodiment, marked as D(n+1) in FIG. 9 and serving as the main control module of the wake-up circuit, mainly functions to receive a wake-up signal with a single pin WKUP. Furthermore, wake-up signals sent by different wake-up sources each are connected to different N pins of the MCU, and these different N pins of the MCU are marked as CHECK1 to CHECKN in FIG. 9. Therefore, when one of the wake-up signals has a waveform change on the corresponding pin of the MCU, the MCU may detect the specific wake-up source which transmits the wake-up signal. The pins may all be GPIO pins of the MCU.

In the embodiment, each of the exclusive-OR gates, marked as D1 to DN, mainly functions to change the wake-up signal sent by the wake-up source to a pulse signal. The exclusive-OR gate (in general, a logic circuit device with an exclusive-OR gate function has 5 pins, and there is also a case of multiple pins, starting from the same basic principles) has two input pins of the exclusive-OR gate respectively serving as a first input and a second input, one output pin of the exclusive-OR gate serving as an output, a power supply pin connected for supplying power to the exclusive-OR gate, and a ground pin for grounding. The delaying module mainly functions to perform delaying on the wake-up signal input from the wake-up source. Therefore, before inputting of a wake-up signal, levels at two inputs of the exclusive-OR gate are identical, and thus a low level is output from the output of the exclusive-OR gate. When there is a wake-up signal and during a time period when the delaying module functions, the levels at two inputs of the exclusive-OR gate are different, and thus a high level is output from the output of the exclusive-OR gate. After the delaying module does not function, the levels at two inputs of the exclusive-OR gate are consistent, and thus the low level is output from the output of the exclusive-OR gate. Thereby, a wake-up signal in the form of the pulse signal is formed, and can be distinguished by the MCU.

Each of the identification modules in the embodiment generate an identification signal for the wake-up signal input, and the identification signal is input to one of pins of the MCU marked as CHECK1 to CHECKN in a one-to-one correspondence manner, for the MCU to identify the wake-up source from which the specific wake-up signal comes.

Isolation modules in the embodiment are configured to isolate multiple wake-up signals input to the pin of the MCU marked as WKUP. The isolation module may generally be a diode or a device which is able to prevent current backflow.

Figure 10:
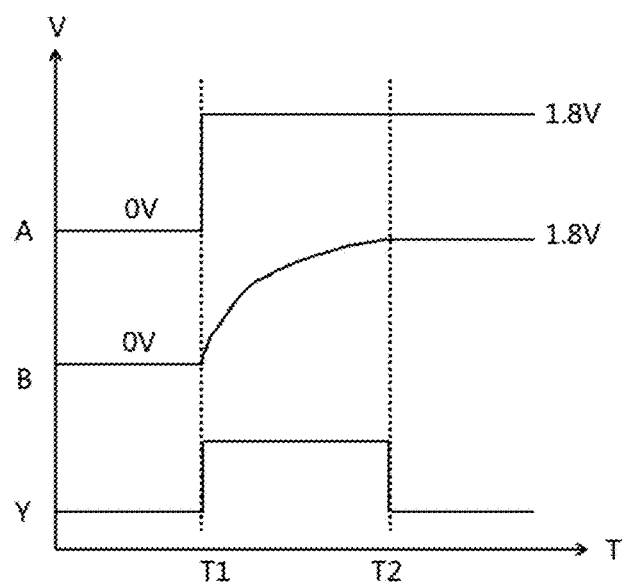
FIG. 10 is a coordinate graph of curves of voltages at inputs of an exclusive-OR gate and a curve of a voltage at an output of the exclusive-OR gate according to an embodiment of the present disclosure.

In curves of voltages at inputs an exclusive-OR gate and a curve of a voltage at the output of the exclusive-OR gate as shown in FIG. 10, A and B on a longitudinal coordinate axis respectively indicate the voltage at a first input of the exclusive-OR gate and the voltage at a second input of the exclusive-OR gate, and Y indicates the voltage at the output of the exclusive-OR gate. T on a horizontal coordinate axis indicates time. It can be seen from waveforms of curves of voltages that, before a time instant T1, input levels at two inputs of the exclusive-OR gate are both 0V, and thus a low level is output from the output of the exclusive-OR gate. At the instant T1, since a wake-up signal is input, the input levels at two inputs of the exclusive-OR gate both change. The input level at the first input of the exclusive-OR gate quickly changes to a high level under the action of the wake-up signal input, and the input level at the second input of the exclusive-OR gate begins to change slowly because of the action of the delaying module which adopts an RC delaying circuit including a second resistor and a first capacitor. During a time period between the time instant T1 to the time instant T2 serving as a delaying time period, since the levels at the two inputs of the exclusive-OR gate are the high level and the low level respectively, a high level is output from the output of the exclusive-OR gate. A formula for calculating a time length T2−T1 of the time period between the time instant T1 to the time instant T2 serving as the delaying time period is as shown in Formula (1):

$$T2-T1 = -R*C*\mathrm{Ln}((E-V)/E) \qquad (1).$$

In the formula, R is a resistance value of the second resistor in Ω, C is a capacitance value of the first capacitor in F; E is a voltage value of the high level input to the second input of the exclusive-OR gate, and V is a voltage value of a level when the first capacitor is in a process of charging.

When the time instant T2 is reached, charging of the capacitor of the second input of the exclusive-OR gate is completed, and the level at the second input of the exclusive-OR gate also changes to the high level. Thus, at the time instant T2, since the input levels at two inputs of the exclusive-OR gate are both the high level, the low level is output from the output of the exclusive-OR gate. In this way, the pulse signal is formed, and it is convenient for the MCU to distinguish the wake-up signal.

Respective modules in the solution of the embodiment may be implemented in the form of hardware, software or a combination thereof, and may be a circuit in various forms. Detailed description is provided through specific implementation solutions.

Embodiment Mode One

Figure 11:
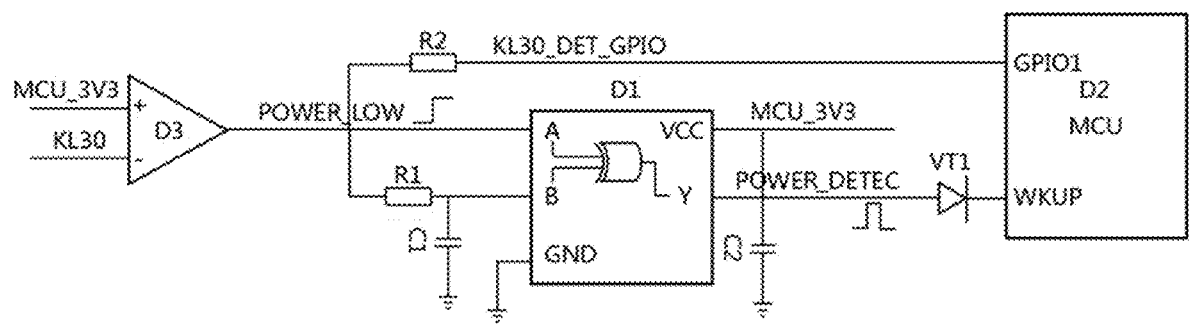
FIG. 11 is a structural diagram of a wake-up circuit according to embodiment mode one of the present disclosure.

As shown in FIG. 11, a wake-up signal sent by a wake-up source in the embodiment mode is a wake-up signal POW- ER_LOW output through a comparator D3 by a pin MCU_3V3 outputting a voltage of 3.3 V of an external single-chip and a supplying electrical potential KL30 output by an external voltage source. The supplying electrical potential KL30 continuously decreases in use. At the beginning, a voltage differential between the supplying electrical potential KL30 and the pin MCU_3V3 outputting the voltage of 3.3 V is relatively great, and the comparator D3 outputs a low level. When a voltage value of the supplying electrical potential KL30 decreases to such a voltage value that an alarm needs to be given, i.e., to a voltage value that is even lower than a voltage value of the pin MCU_3V3 outputting the voltage of 3.3 V, the comparator D3 outputs a high level. That is, the wake-up signal POWER_LOW has a waveform of a rising edge changing from low to high. At this time, a voltage value of a first input A of an exclusive-OR gate quickly changes to 1.8V. A second input B of the exclusive-OR gate is connected to an RC delaying circuit formed by a second resistor R1 and a first capacitor C1. A resistance value of the second resistor R1 is 100Ω, and a capacitance value of the first capacitor C1 is $1000*1/1000000$. A voltage value of the high level input to the second input of the exclusive-OR gate is 1.8 V, and a voltage value of a level of the first capacitor reached during charging is 1.6V. A time length T of a delaying time period of the RC delaying circuit calculated according to the formula (1) is as follows:

$$T=-100*1000*1/1000000*\ln((1.8-1.6)/1.8)=0.2197 \text{ s}.$$

Figure 12:
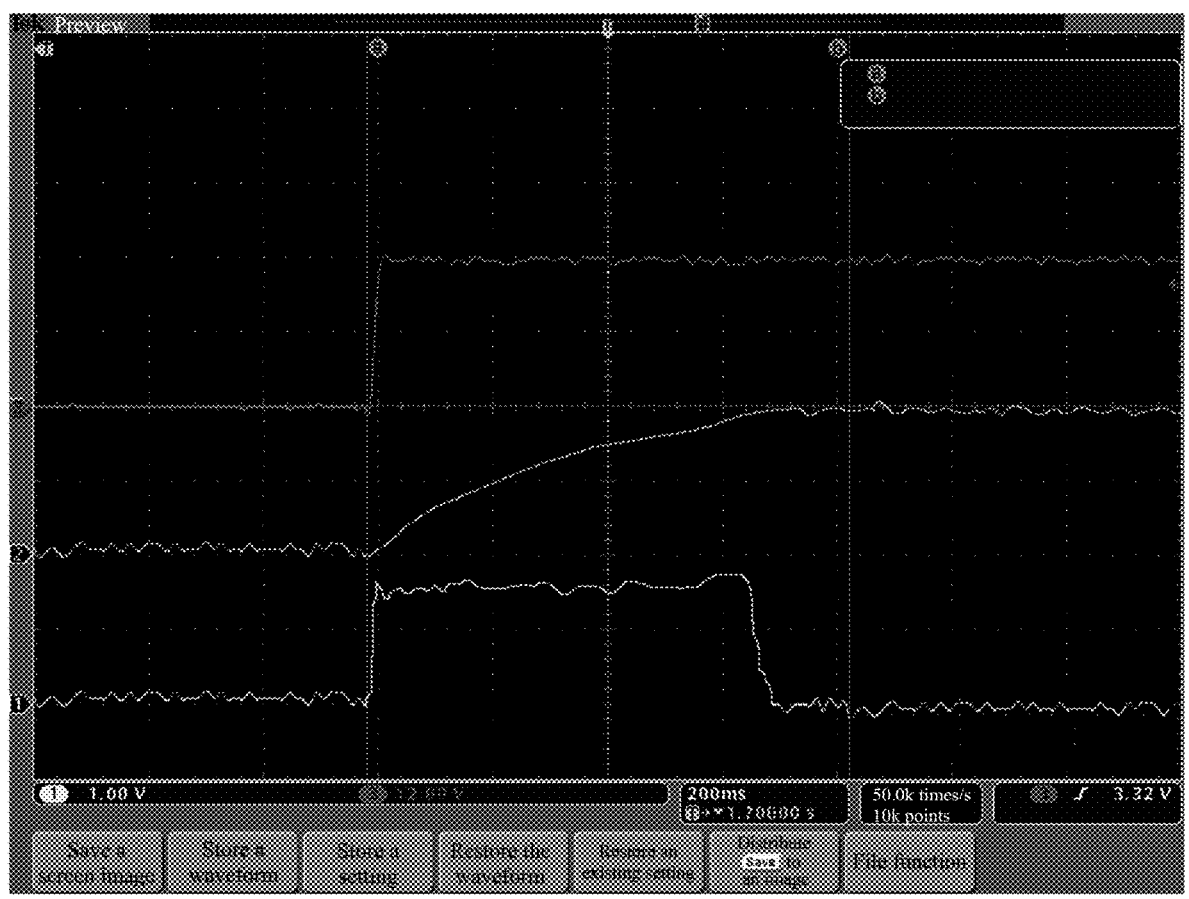
FIG. 12 is a waveform diagram of variations of a voltage at a first input A of an exclusive-OR gate, a voltage at a second input B of the exclusive-OR gate, and a voltage at an output Y of the exclusive-OR gate according to the embodiment mode one of the present disclosure.

There is a scope for a general logic circuit MCU to determine the high level, and thus when a minimum low voltage of the high level is reached, the high level can be determined by the exclusive-OR gate D1. The second input of the exclusive-OR gate reaches 1.6 V with a delay of 0.2197 second, and the exclusive-OR gate D1 determines that the second input of the exclusive-OR gate has the high level. Accordingly, before a wake-up signal POWER_DE-TEC is sent, an output of the exclusive-OR gate is enabled to output 0 V; after the wake-up signal POWER_DETEC is sent, the output of the exclusive-OR gate is enabled to output the high level during a time length of 0.2197 second; and thereafter, the output of the exclusive-OR gate is enabled to output 0 V again. Specific waveforms of voltage changes at the first input A of the exclusive-OR gate, the second input B of the exclusive-OR gate, and the output Y of the exclusive-OR gate are as shown in FIG. 12.

Furthermore, in FIG. 11, a first resistor serving as an identification module is marked as R2. The exclusive-OR gate further has a power supply end and a ground end for grounding, marked as VCC and GND respectively. The pin MCU_3V3 outputting the voltage of 3.3 V of the external single-chip supplies power to the power supply end. An isolation module is a diode VT1, and a MCU is marked as D2. A pin WKUP and a pin GPIO of the MCU are respectively configured to receive a wake-up signal POWER_DE-TEC in the form of a pulse signal and a wake-up signal KL30_DET_GPIO after current-limiting. The power supply end of the exclusive-OR gate and the output Y of the exclusive-OR gate are both connected to one electrode of a second capacitor C2, and the other electrode of the second capacitor C2 is grounded. The second capacitor C2 may play a role of filtering.

In this way, an exclusive-OR gate is used, and a same wake-up signal is input to two inputs of the exclusive-OR gate. However, an RC delaying circuit is added to a second input of the exclusive-OR gate, so that the exclusive-OR gate generates signal inversion within a time period. That is, a rising edge signal of the wake-up signal is converted into a pulse signal, so that a MCU is enabled to perform detection on the wake-up signal and that the wake-up signal is connected to a pin GPIO of the MCU for identifying a specific wake-up source. This wake-up circuit can detect the wake-up signal for many times accurately and efficiently, has very low cost, occupies a small area, and enables a product to have greater reliability by using diodes to isolate wake-up signals generated by different wake-up sources.

Embodiment Mode Two

Figure 13:
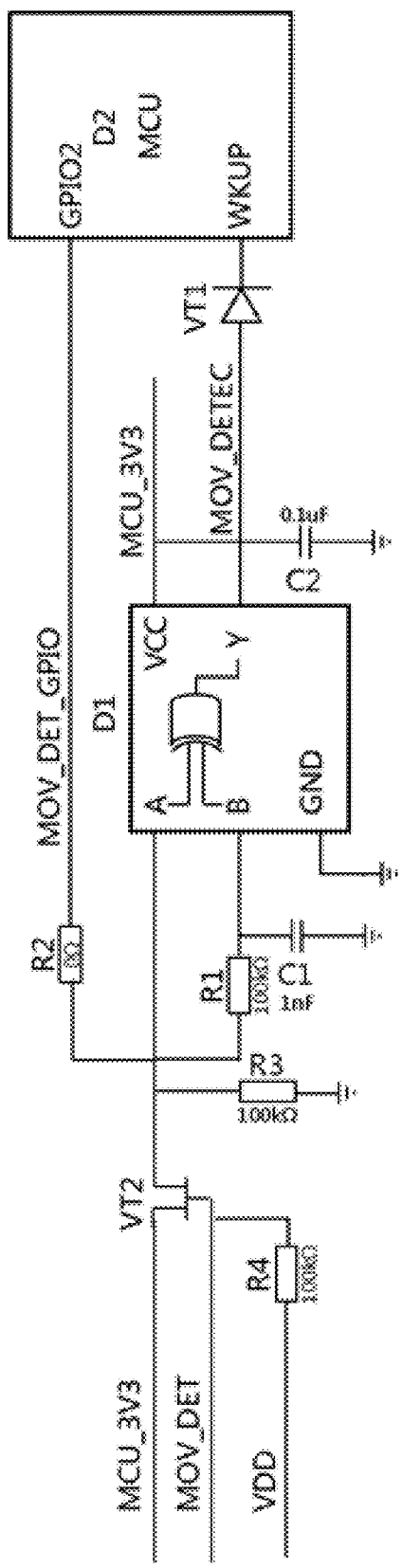
FIG. 13 is a structural diagram of a wake-up circuit according to embodiment mode two of the present disclosure.

As shown in FIG. 13, in a wake-up source in the embodiment mode, a signal source MOV_DET initially has a signal of a high level. The signal source MOV_DET and a pin MCU_3V3 outputting a voltage of 3.3 V of an external single-chip are respectively connected to a collector of a triode switch VT2 and a base of the triode switch VT2. One end of a fourth resistor R4 is connected to the signal source MOV_DET, and the other end of the fourth resistor R4 is connected to a voltage source VDD. A pull-up resistance of the signal source MOV_DET connected to the fourth resistor R4 is pulled up to a level provided by the voltage source VDD, and the voltage source VDD generally provides a relatively high level. One end of a third resistor R3 is connected to an emitter electrode of the triode switch VT2, and the other end of the third resistor R3 is grounded. The third resistor R3 is a pull-down resistor. A signal emitted by the emitter electrode of the triode switch VT2 is used as a wake-up signal. The emitter electrode of the triode switch VT2 is connected to a first input of an exclusive-OR gate D1. In a default state, since the triode switch VT2 is turned off, the first input of the exclusive-OR gate D1 and the second input of the exclusive-OR gate D1 both have a low level. When a level value of the signal source MOV_DET becomes low, the triode switch VT2 is turned on and outputs the wake-up signal, and levels of the first input A of the exclusive-OR gate D1 and the second input B of the exclusive-OR gate D1 both change to a high level. The level of the second input of the exclusive-OR gate D1 changes to the high level after delaying, and thus a wake-up signal MOV_DETEC in the form of a pulse signal is output from the output of the exclusive-OR gate D1, and the wake-up signal MOV_DETEC is transmitted to a pin WKUP marked as D2 of the MCU. Meanwhile, the wake-up signal also undergoes currently-limiting by a first resistor R2 serving as an identification module to generate a signal MOV_DET_GPIO sent to a pin GPIO2 of the MCU, so that the MCU may identify the wake-up signal. An RC delaying circuit is formed by a second resistor R1 and a first capacitor C1. The exclusive-OR gate further has a power supply end and a ground end for grounding, marked as VCC and GND respectively. The pin MCU_3V3 outputting the voltage of 3.3 V supplies power to the power supply end. The power supply end of the exclusive-OR gate and the output Y of the exclusive-OR gate are both connected to one electrode of a second capacitor C2, and the other electrode of the second capacitor C2 is grounded. The second capacitor C2 may play a role of filtering. An isolation module is a diode VT1.

The MCU receiving the wake-up signal forwarded includes the following steps. At step 501, the MCU reads whether the pin WKUP of the MCU has a rising edge of a signal sent. If the rising edge of the signal sent is generated, step 502 is executed; otherwise, if there is no rising edge of the signal sent, step 501 is executed continuously. At step 502, the MCU reads whether the pin GPIO2 of the MCU has a high level. If the MCU has the high level, step 503 is executed; otherwise, if the MCU has a low level, step 504 is executed. At step 503, the MCU determines that a wake-up signal is received at the time, and the MCU is waked up to complete receiving the wake-up signal forwarded once, a process then turning to step 501 to continue to receive the next wake-up signal forwarded. At step 504, the MCU reads whether the pin GPIO2 of the MCU has the high level. If the pin GPIO2 of the MCU has the high level, step 505 is executed; otherwise, if the pin GPIO2 of the MCU has the low level, the MCU continues to detect the next pin GPIO2 of the MCU, until the final pin GPIO2 of the MCU is detected. At step 505, the MCU determines that the wake-up signal is received at the time, and the MCU is waked up, and the process returning to step 501 to receive the next wake-up signal forwarded. At step 506, the MCU reads whether the final pin GPIO2 of the MCU has the high level. If the final pin GPIO2 of the MCU has the high level, step 507 is executed; otherwise, if the final pin GPIO2 of the MCU does not have the high level, it is considered that none of wake-up sources has the wake-up signal and that it is a false determination that the signal sent from the pin WKUP of the MCU has the rising edge, the process returning to step 501 to receive the next wake-up signal forwarded. At step 507, the MCU determines that the wake-up signal is received at the time, and the process then returns to step 501.

An embodiment of the present disclosure further provides a non-transitory computer-readable storage medium which includes a stored program. Herein, the program, when running, executes steps of any of the above methods.

An embodiment of the present disclosure further provides a processor which is configured for running of a program. Herein, the program, when running, executes steps of any of the above methods.

In the embodiment, the above storage medium may include, but is not limited to, various mediums that may store program codes, such as a USB flash disk, a read only memory (ROM), a random access memory (RAM), a mobile HDD, a magnetic disk, or an optical disk.

In embodiments of the present disclosure, a wake-up module is configured to detect a wake-up signal sent by a wake-up source and to forward the wake-up signal to a main control module, one or more wake-up sources being provided. A main control module is connected to the wake-up module and is configured to receive the wake-up signal forwarded, one main control module being provided. In this way, several wake-up sources may be connected to one main control module, and the one main control module may receive wake-up signals sent by multiple wake-up sources, so that the cost of the wake-up circuit is reduced and that the wake-up circuit is suitable for detection of multiple wake-up sources, thereby solving the problems in related technologies that the cost is high due to a relatively large number of comparators used for one wake-up source and that the wake-up circuit cannot perform detection when there are multiple wake-up sources.

A person of ordinary skill in the art may understand that, all or some steps of the method disclosed above and functional modules/units of a system or a device may be implemented as software, firmware, hardware, and a proper combination thereof. In an embodiment of the hardware, a division of the functional modules/units mentioned in the above description does not necessarily correspond to a division of physical components. For example, one physical component may have multiple functions, or one function or step may be implemented by multiple physical components cooperatively. Some components or all components may be implemented as software executed by a processor, such as a digital signal processor or a microprocessor, or may be implemented as hardware, or may be implemented as an integrated circuit, such as an application-specific integrated circuit. Such software may be distributed on a computer readable medium, and the computer readable medium may include a computer storage medium (or non-transient medium) and a communications medium (or transient medium). As is known to a person of ordinary skill in the art, the term of computer storage medium includes volatile and non-volatile, removable and non-removable mediums that may be implemented in an method or technology for storing information (such as a computer readable instruction, a data structure, and a program module or other data). The computer storage medium includes, but is not limited to, an RAM, an ROM, an EEPROM, a flash memory or other memory technology, a CD-ROM, a digital video disk (DVD) or other optical disk storage, a magnetic cassette, a magnetic tape, a magnetic disk storage or other magnetic storage device, or any other medium which can be used to store the desired information and which can be accessed by a computer. The above described are only preferred embodiments of the present disclosure and are not intended to limit the present disclosure. For those skilled in the art, various modifications and changes may be made to the present disclosure. Any modification, equivalent replacement, improvement, etc. made within the principles of the present disclosure shall be included in the protection scope of the present disclosure.

What is claimed is:

1. A wake-up circuit, comprising:
   a wake-up module, which is connected to a wake-up source, and which is configured to detect a wake-up signal sent by the wake-up source and forward the wake-up signal to a main control module, wherein one or more wake-up sources are provided; and
   the main control module, which is connected to the wake-up module, and which is configured to receive the wake-up signal forwarded, wherein one main control module is provided,
   wherein the wake-up circuit further comprises an identification module, which is connected between the wake-up source connected to the wake-up module and the main control module, and which is configured to send the wake-up signal transmitted by the wake-up source to the main control module for identification.

2. The wake-up circuit according to claim 1, wherein wake-up modules and wake-up sources connected to the wake-up modules are provided in one-to-one correspondence, and the wake-up sources and identification modules connected to the wake-up sources are provided in one-to-one correspondence.

3. The wake-up circuit according to claim 1, wherein the wake-up circuit further comprises a delaying module, which is connected between the wake-up source connected to the wake-up module and the wake-up module, and which is configured to perform delaying on the wake-up signal transmitted by the wake-up source before transmitting the wake-up signal in the form of a pulse signal to the main control module, wherein wake-up modules and delaying modules connected to the wake-up modules are provided in one-to-one correspondence.

4. The wake-up circuit according to claim 1, wherein the wake-up circuit further comprises an isolation module, which is connected between the wake-up module and the main control module, and which is configured to isolate a backflow current transmitted by the main control module to the wake-up module, wherein wake-up modules and isolation modules connected to the wake-up modules are provided in one-to-one correspondence.

5. The wake-up circuit according to claim 3, wherein the wake-up module is an exclusive-OR gate with a first input connected to an output of the wake-up source and with a second input connected to an end of the delaying module, the other end of the delaying module being connected to the output of the wake-up source, an output of each of exclusive-OR gates being connected to one pin of the main control module; and wherein the exclusive-OR gate is configured to perform operation on a wake-up signal output from the output of the wake-up source and a delayed signal formed after the wake-up signal undergoes delaying by the delaying module, before transmitting the wake-up signal in the form of the pulse signal to the main control module.

6. The wake-up circuit according to claim 5, wherein the main control module is a MCU, and the pin connected to the output of each of the exclusive-OR gates is configured to receive the wake-up signal in the form of the pulse signal; and wherein the MCU further includes pins which are provided in one-to-one correspondence with identification modules, wherein an end of each of the identification modules is connected to a corresponding pin of the MCU, and the other end of each of the identification modules is connected to the output of a corresponding wake-up source.

7. The wake-up circuit according to claim 6, wherein the identification module is a first resistor, which is configured to performing current-limiting on the wake-up signal sent from the output of the wake-up source to the corresponding pin of the MCU before transmitting the wake-up signal to the MCU for identification.

8. The wake-up circuit according to claim 6, wherein the delaying module is an RC delaying circuit, which comprises a second resistor and a first capacitor; and wherein an end of the second resistor is connected to the output of the wake-up source, and the other end of the second resistor and one electrode of the first capacitor are connected to the second input of the exclusive-OR gate, the other electrode of the first capacitor being grounded.

9. The wake-up circuit according to claim 6, wherein the wake-up circuit further comprises an isolation module, which is connected between the wake-up module and the main control module, and which is configured to isolate a backflow current transmitted by the main control module to the wake-up module, wherein wake-up modules and isolation modules connected to the wake-up modules are provided in one-to-one correspondence; and wherein the isolation module is a diode, wherein an anode of each of diodes is connected to the output of a respective one of exclusive-OR gates, and a cathode of each of the diodes is connected to the one pin of the MCU.

10. A wake-up method based on the wake-up circuit according to claim 1, comprising:

detecting, by the wake-up module, a wake-up signal sent by the wake-up source, and forwarding the wake-up signal to the main control module; and receiving, by the main control module, the wake-up signal forwarded, wherein the wake-up method further comprises:

sending, by the identification module, the wake-up signal transmitted by the wake-up source to the main control module for identification.

11. The wake-up method according to claim 10, wherein detecting the wake-up signal sent by the wake-up source comprises:

outputting a wake-up signal from an output of the wake-up source;

transmitting the wake-up signal output to a first input of an exclusive-OR gate and an RC delaying circuit respectively;

performing, by the exclusive-OR gate, after a delayed signal is formed by performing delaying on the wake-up signal by the RC delaying circuit, operation on the wake-up signal output from the output of the wake-up source and the delayed signal formed after the wake-up signal undergoes delaying by the delaying module so as to obtain the wake-up signal in the form of a pulse signal.

12. The wake-up method according to claim 11, wherein performing, by the exclusive-OR gate, operation on the wake-up signal output from the output of the wake-up source and the delayed signal formed after the wake-up signal undergoes delaying by the delaying module so as to obtain the wake-up signal in the form of the pulse signal comprises:

outputting a low level from an output of the exclusive-OR gate, as an input level at the first input of the exclusive-OR gate and an input level at a second input of the exclusive-OR gate are identical before the wake-up signal output is transmitted to the first input of the exclusive-OR gate and the RC delaying circuit respectively;

outputting a high level from the output of the exclusive-OR gate, as the input level at the first input of the exclusive-OR gate and the input level at the second input of the exclusive-OR gate are different when the wake-up signal output is transmitted to the first input of the exclusive-OR gate and the RC delaying circuit respectively, during a time period of delaying; and outputting the low level from the output of the exclusive-OR gate, as the input level at the first input of the exclusive-OR gate and the input level at the second input of the exclusive-OR gate are identical after the time period of delaying, so as to form the wake-up signal in the form of a pulse signal.

13. The wake-up method according to claim 11, wherein detecting the wake-up signal sent by the wake-up source further comprises:

transmitting the wake-up signal sent from the output of the wake-up source further undergoing current-limiting by a first resistor to a corresponding pin of an MCU; and determining, by the MCU, a corresponding wake-up source which transmits the wake-up signal according to the corresponding pin of the MCU to which the wake-up signal is transmitted to.

14. A non-transitory computer-readable storage medium, storing a program, which, when running, executes the method according to claim 10.

* * * * *